(12) United States Patent
Amir

(10) Patent No.: US 6,840,169 B2
(45) Date of Patent: *Jan. 11, 2005

(54) METHODS FOR MANUFACTURING PRINTED CIRCUIT BOARDS USING A PARTIAL PRINTING PROCESS AND APPARATUS

(75) Inventor: Dudi Amir, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/657,681

(22) Filed: Sep. 8, 2003

(65) Prior Publication Data

US 2004/0050268 A1 Mar. 18, 2004

Related U.S. Application Data

(62) Division of application No. 09/434,944, filed on Nov. 5, 1999, now Pat. No. 6,626,099.

(51) Int. Cl.[7] .............................................. B41M 1/12
(52) U.S. Cl. ...................................... 101/129; 101/123
(58) Field of Search ................................ 101/123, 124, 101/127, 129; 118/406, 410, 413

(56) References Cited

U.S. PATENT DOCUMENTS

| | | | |
|---|---|---|---|
| 5,185,040 A | 2/1993 | Sakai et al. ................. | 118/406 |
| 5,287,806 A | 2/1994 | Nanzai ....................... | 101/123 |
| 5,524,537 A | 6/1996 | van der Meulen .......... | 101/120 |
| 5,786,701 A | 7/1998 | Pedder ....................... | 324/754 |
| 5,825,629 A | 10/1998 | Hoebener et al. ........... | 361/777 |
| 5,868,302 A | 2/1999 | Onishi et al. .......... | 228/180.21 |
| 5,909,634 A | 6/1999 | Hotchkiss et al. .......... | 438/612 |
| 5,922,496 A * | 7/1999 | Dalal et al. .................... | 430/5 |
| 5,925,187 A | 7/1999 | Freeman et al. ............ | 118/667 |
| 6,272,984 B1 | 8/2001 | Kato et al. .................. | 101/129 |
| 6,286,422 B1 | 9/2001 | Lin et al. .................... | 101/123 |

OTHER PUBLICATIONS

"DEK: Refinements to the ProFlow Cassette", http://www.dek.com/printing machines/products/proflow2/semco/default.htm. Semco products under license from DEK.,(Aug. 4, 1999), 6 pgs.

"Ultraprint 3000 HiE Series; Rheometric Pump Print Head", http://www.mpmcorp.com/ultra3000/rheopump/rheopump faq a10.html, MPM Corporation 1998, (1998), 20 pgs.

Bell, Richard, "Enclosed Print Heads —The Only Alternative?", *IPC/SMTA Electronic Assembly Expo., 1998 Proceedings of the Technical Program*, (1998),571–575.

(List continued on next page.)

*Primary Examiner*—Ren Yan
(74) *Attorney, Agent, or Firm*—Schwegman, Lundberg, Woessner & Kluth, P.A.

(57) ABSTRACT

An apparatus for preventing media deposition in predetermined locations comprising at least one blocking cap connected to a pressurized squeegee head is disclosed. In one embodiment, a method for partially printing a circuit board is disclosed. The method comprises inserting one or more blocking caps inside a pressurized squeegee head and printing with the pressurized squeegee head. In this way, defined areas on the surface of a stencil or screen, over which the blocking caps travel, are skipped. In another embodiment, a new method for manufacturing printed circuit boards is described, comprising placing a component on a circuit board, performing burn-in or testing of the component, partially printing attachment media on the circuit board with a pressurized squeegee head containing one or more blocking caps, and placing additional components on the circuit board. In one embodiment, the circuit board is sold or returned to the circuit board designer before performing the partial printing step.

20 Claims, 6 Drawing Sheets

OTHER PUBLICATIONS

Clasper, Simon, "Printing With Proflow Direkt Imaging", *Nepcon West 99 Proceeding*, (Feb. 21–25, 1999),397–402.

Manessis, D., et al., "A Characterization Study of Direct Imaging Technique for Stencil Printing of Thick Boards (0.125") in the Alternative Assembly and Reflow Technology (AART) or Pin–In–Paste Process", *23rd IEEE/CPMT International Electronic Manufacturing Technology Symposium*, (Oct. 19–21, 1998),92–99.

Nauss, Ed, et al., "Rheometric Pump Print Head Technology",*Proceedings of the Technical Program NEPCON West Conference '98, vol. 1,* (Mar. 1–5, 1998), 237–241.

Prasad, Ray P., *In: Surface Mount Technology, Principles and Practice,* Kluwer Academic Publishers,(1997),31–50; 404–421.

* cited by examiner

METHODS FOR MANUFACTURING PRINTED CIRCUIT BOARDS USING A PARTIAL PRINTING PROCESS AND APPARATUS

REFERENCE TO RELATED APPLICATIONS

This application is a divisional of U.S. patent application Ser. No. 09/434,944, filed Nov. 5, 1999, now issued as U.S. Pat. No. 6,626,099, which is incorporated herein by reference.

FIELD

This invention relates generally to circuit board printing processes, and in particular, the present invention relates to methods for manufacturing printed circuit boards using a partial printing process and apparatus.

BACKGROUND

Surface mounting involves a planar mounting of components to a circuit board having a previously-applied conductive pattern. The components may be individual surface-mounted components, flip chips, tape automated bonding formats, and so forth. The conductive pattern for most components is obtained by a printing process that involves depositing a layer of attachment media, such as solder paste, onto a stencil or screen. Solder is forced through openings in the stencil or screen onto pads located on the circuit board below using a conventional squeegee blade. Alternatively, pressurized squeegee heads having two squeegee blades can be used to apply the solder with the use of internal pressure, by either rolling it onto the stencil or forcing it through the stencil openings. This is in contrast to the conventional squeegee blade in which solder paste is applied as it rolls in front of a single blade. With either type of system, these processes produce a full or complete printing of the entire circuit board in one step, after which the components are placed on the circuit board in the usual manner.

Full printing, however, provides limited flexibility in terms of being able to apply components at different times, as the surface over which the squeegee blade or head travels needs to be substantially planar. Failure of a die after it and all of the other components have been added to the circuit board can be costly. As a result, many manufacturers use various package processes, such as a controlled collapse chip connection (C4) process, to produce a package containing the die. In this way burn-in and testing of the die can take place prior to mounting it on the board. Such packages are costly to produce, however, and failure of the die after it is part of the package is also expensive. Such cost concerns have caused many manufacturers to limit their designs so as to produce smaller packages, eliminate large or heavy parts, avoid double-sided circuit boards, and so forth.

An alternative "two-step" printing process is sometimes used when different pitches of print are desirable. The first step involves a first printing or fluxing for the die. A second or "partial" printing is then performed using a step-down stencil of varying thickness to block the pre-printed (or fluxed) die locations. Following the second printing, components (including surface mount components and the die) are placed on the circuit board in the usual manner. Typically, the entire process is performed in a clean room, although a clean room is only necessary for placing the die on the circuit board. However, the same problem of costly die failure exists.

Another means by which a "partial" print is obtained involves dispensing solder paste through the needle of a syringe. This method is very slow, however, because the paste is dispensed onto only one pad or "land" at a time. Clogging of needles is also a common problem with this method. Special dispense heads can be used to reduce the cycle time, although this increases the costs of the process significantly. Furthermore, due to the high cost of these processes, the complexity of the circuit board or module design is limited.

For the reasons stated above, there is a need in the art for a more convenient and economic method of manufacturing circuit boards using partial printing.

SUMMARY

An apparatus for preventing media deposition in predetermined locations comprising at least one blocking cap connected to a pressurized squeegee head is disclosed. In one embodiment, a method for partially printing a circuit board is disclosed. The method comprises inserting one or more blocking caps inside a pressurized squeegee head and printing with the pressurized squeegee head. In this way, defined areas on the surface of a stencil or screen, over which the blocking caps travel, are skipped.

In another embodiment, a new method for manufacturing printed circuit boards is described, comprising placing a component on a circuit board, performing testing of the component, partially printing attachment media on the circuit board with a pressurized squeegee head containing one or more blocking caps, and placing additional components on the circuit board. In one embodiment, the circuit board is sold or returned to the circuit board designer before performing the partial printing step.

DETAILED DESCRIPTION

Figure 1:
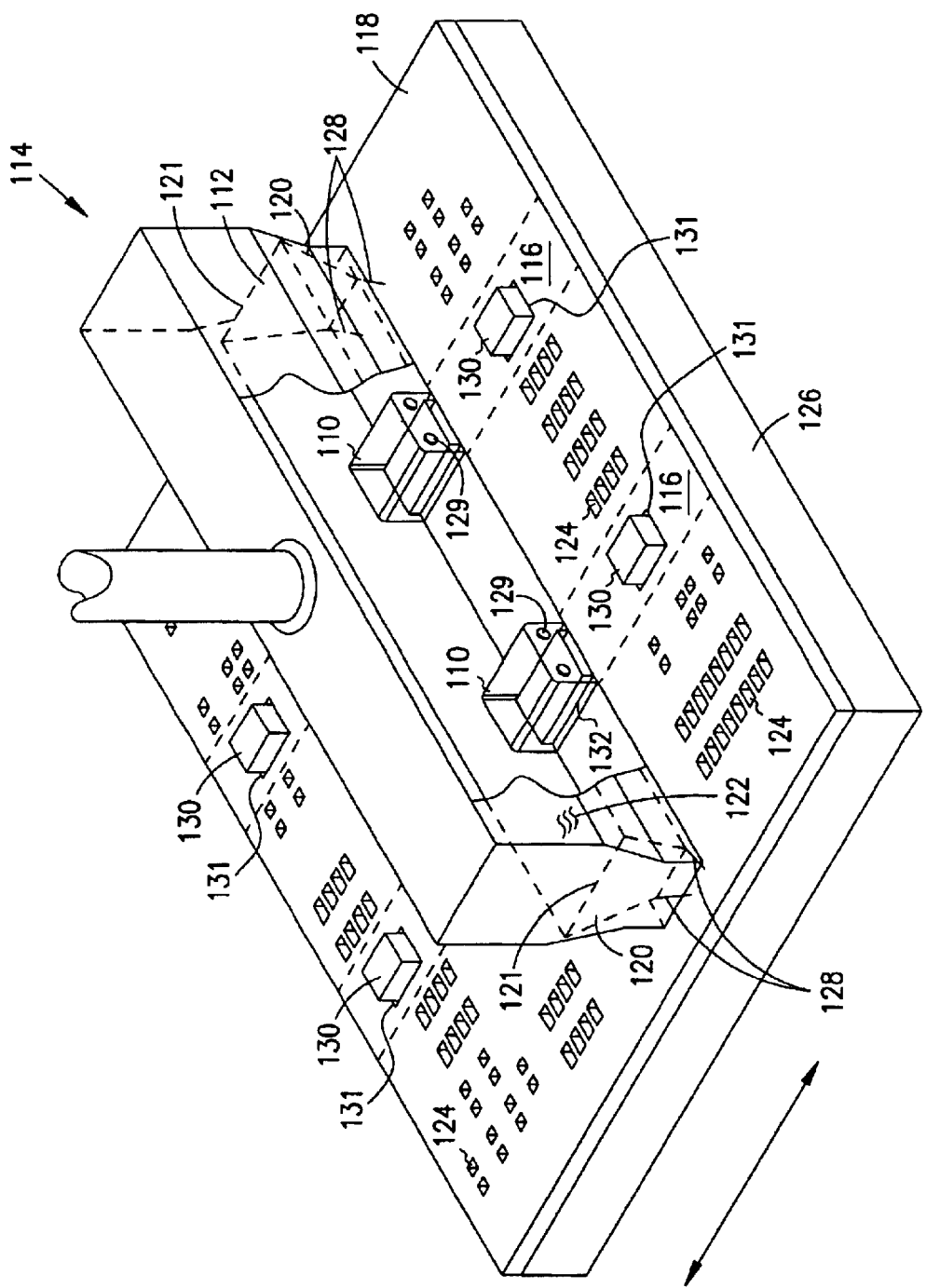
FIG. 1 is a perspective view of two blocking caps secured inside a pressurized squeegee head during a partial print operation in one embodiment of the present invention.

An apparatus and method for partially printing circuit boards is disclosed. In the following detailed description, reference is made to the accompanying drawings which form a part hereof, and in which is shown by way of illustration specific embodiments in which the inventions may be practiced. In the drawings, like numerals describe substantially similar components throughout the several views. These embodiments are described in sufficient detail to enable those skilled in the art to practice the invention, and it is to be understood that other embodiments may be utilized and that mechanical, procedural, electrical and other changes may be made without departing from the spirit and scope of the present inventions. The following detailed description is, therefore, not to be taken in a limiting sense, and the scope of the present invention is defined only by the appended claims, along with the full scope of equivalents to which such claims are entitled.

In one embodiment, a blocking cap capable of preventing an attachment media from being applied to a particular area is provided. Unlike conventional printing processes which spread attachment media across the entire surface of a stencil or screen, the partial printing process of the present invention utilizes a blocking cap to create a strip where there is no printing in areas where previously-placed components are located. In another embodiment, more than one blocking cap is used.

The blocking caps 110 fit inside a conditioning chamber 112 of a pressurized squeegee head 114 as shown in FIG. 1. In another embodiment, the blocking caps 110 are integral with the pressurized squeegee head 114, which is manufactured together with the blocking caps 110. The blocking caps 110 allow defined areas 116 on the surface of a stencil (or screen) 118 to be skipped. The conditioning chamber 112 is formed by two angled plates 120, each of which is connected to an end plate 121. The conditioning chamber 112 is filled with an attachment media 122, such as solder paste. Squeegee blades 128, which are attached to the edges of each of the two angled plates 120 and to each of the two end plates 121 provide a seal to surrounding areas. In this way, attachment media 122 is confined within the area of the conditioning chamber 112.

The attachment media 122 is deposited onto pads (not shown) on a circuit board array 126 located beneath the stencil 118. The attachment media 122 enters the circuit board array 126 through apertures 124 in the stencil 118. In the embodiment shown in FIG. 1, the blocking caps 110 are secured to the conditioning chamber 112 with bolts 129. In an alternative embodiment, rails are added to the inside of the conditioning chamber 112 so that the blocking caps 110 can be slid into position.

Although FIG. 1 shows two blocking caps 110, in practice, any suitable number of blocking caps 110 can be used. The blocking caps 110 can be any suitable size and shape as long as they prevent the attachment media 122 from being deposited onto the defined areas 116 and provide adequate clearance along each side of previously-placed components 130. Further, the blocking caps 110 should be deep enough to allow the pressurized squeegee head 114 to pass over the pre-placed components 130 without making contact with the components 130. In the embodiment shown in FIG. 1, the blocking caps 110 are substantially rectangular-shaped objects, although the invention is not so limited. In one embodiment, at least two of the vertical surfaces of the blocking cap 110, such as the sides of the blocking cap 110, are angled inwardly at a suitable angle, such as about less than five (5) to about 45 degrees. In another embodiment, the configuration of the pressurized squeegee head 114 and/or the conditioning chamber 112 is altered to accommodate a particular shape or size of blocking cap 110, or a particular number of blocking caps 110.

Each blocking cap 110 can be open on the bottom and have a lip 132 along two sides of a bottom edge. The lips 132 help to prevent the attachment media 122 from leaking into the defined or blocked areas 116. In the embodiment shown in FIG. 1, neither end of the blocking cap 110 has a lip, but is raised to provide clearance for the components 130 that are located in the defined areas 116 (but secured to the board array 126). In another embodiment, the components 130 are about the same height as the stencil 118 and there is no need for the blocking caps 110 to provide additional clearance above these components. In this embodiment, the bottom edges of the ends of the blocking cap 110 are substantially flush with the bottom edges of the sides of the blocking cap 110, although any of the bottom edges can have lips 132 as needed. Any of a variety of components 130 may be secured to the board array 126 prior to printing with the pressurized squeegee head 114, including, but not limited to a bare die, a packaged component, and so forth.

In the embodiment shown in FIG. 1, each blocking cap 110 has rounded edges and corners which may help to provide an even flow of attachment media 122 around the exterior of the blocking cap 110. In one embodiment, each blocking cap 110 is about 10 to 35 mm wide, about 10 to 35 mm long, and about 10 to 35 mm tall. In a particular embodiment, there is about one (1) to four (4) mm clearance on either side of the component 130, although this depends on the particular application.

As noted above, the blocking caps 110 are positioned over the top of a component 130 or a row of components 130, such as pre-built dies located on the board arrays 126. The components 130 stick up through holes 131 on the surface of the stencil 118. The blocking caps 110 can be aligned manually or automatically. In one embodiment, the blocking caps 110 are aligned by hand over the components 130. In a particular embodiment, a measuring device is located along the side of the conditioning chamber 112 and a corresponding measuring device is located along a frame on which the board array 126 is positioned. In this way, the blocking caps 110 can be accurately positioned over the components 130 by placing them in the same location along the measuring device. In an alternative embodiment, the blocking caps 110 are connected to a optical alignment system, such as a machine vision system for proper alignment.

The blocking caps 110 can be made from any suitable material which is durable for the given operating conditions, does not decompose in the presence of the attachment media 122, and so forth. In one embodiment, each blocking cap 110 is made from rubber, plastic, polyurethane or any suitable metal with a protective coating as is known in the art. In another embodiment, the blocking caps 110 are made from the same material as any type of squeegee blade known in the art, including metal blades.

The blocking caps 110 can be used in any application in which a conventional pressurized squeegee head 114 and attachment media 122 are used. Typically, a thixotropic media such as solder paste (solder) is used as an attachment media in surface mount technology (SMT), although in certain applications it may be desirable to use nonthixatropic medias. In one embodiment, liquid flux or adhesive paste is used instead of solder paste. In one exemplary embodiment, solder paste is used together with a DEK ProFlow print head from DEK Printing Machines Ltd., in Weymouth, England. In another embodiment a MPM Rheometric Pump Print Head from MPM, Inc., in Franklin, Mass. is used.

Figure 2:
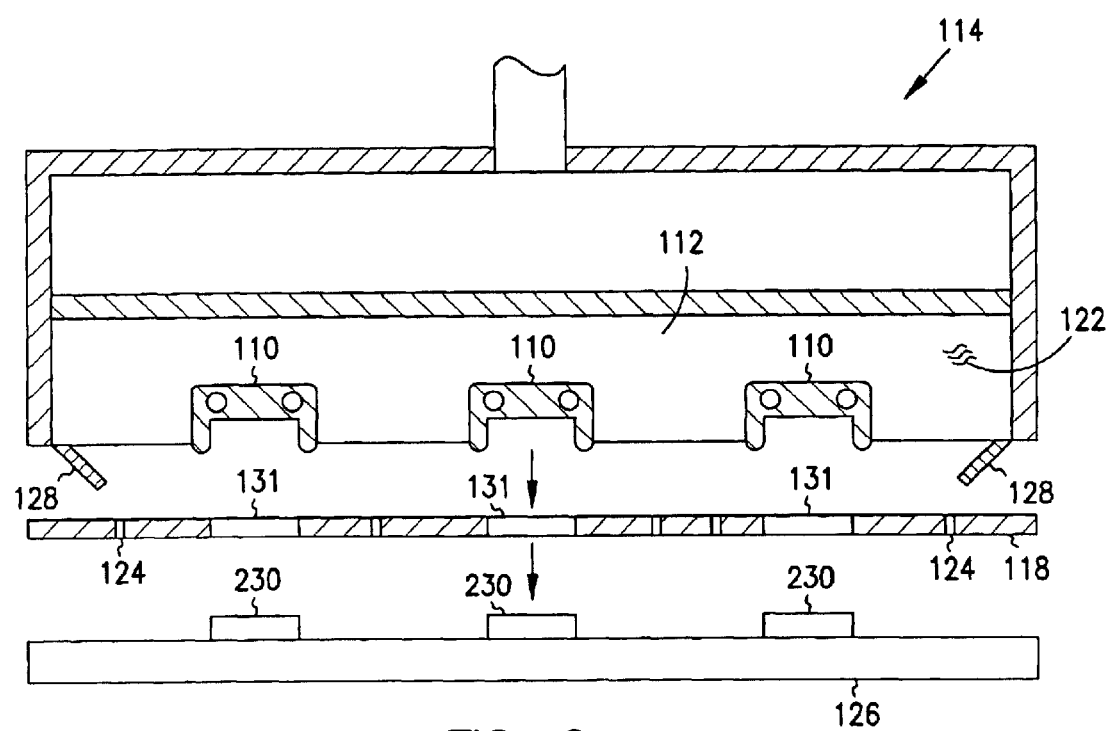
FIG. 2 is an exploded front view of three blocking caps secured inside a pressurized squeegee head directly above previously-placed dice in one embodiment of the present invention.

FIG. 2 is an exploded front view of three blocking caps 110 secured inside a pressurized squeegee head 114. In this embodiment, the board array 126 contains three rows of pre-built dice 230. The pre-built dice 230 have been secured to the board array 126 in any suitable manner. Placement of the blocking caps 110 as shown prevents deposition of the attachment media 122 onto the row of dice 230 and onto an area immediately surrounding the dice 230.

Any conventional type of stencil 118 can be used. In one embodiment, the stencil 118 is about the same height as the component 130 which has been previously placed on the board array 126. In the embodiment shown in FIG. 2, the stencil 118 has openings 232 in the locations of the previously placed dice 230. The openings can extend through to the top of the stencil 118, but the invention is not so limited.

Referring again to FIG. 1, in operation, the pressurized squeegee head 114 travels along the surface of the stencil 118 in either direction as shown. As the head 114 travels, the attachment media 122 is forced out of the open bottom of the conditioning chamber 112. As a result, the attachment media 122 is spread along the surface of the stencil 118, except in the defined areas 116 blocked by the blocking caps 110. In this way, a "partial" print is obtained. Once printing is completed, the stencil 118 itself is relatively "clean" as there is typically little, if any, attachment media 122 remaining on the surface of the stencil 118.

Figure 3:
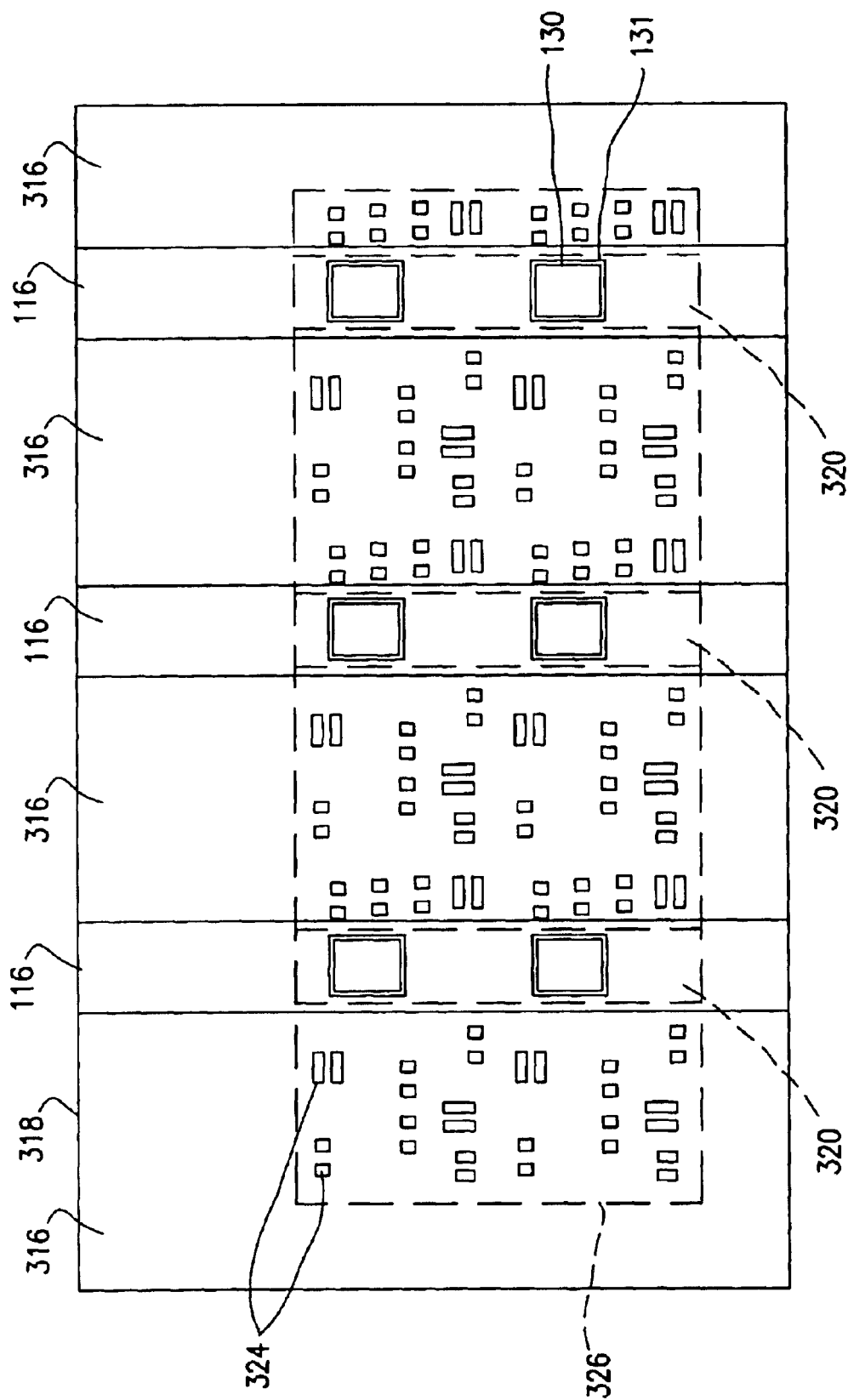
FIG. 3 is a schematic illustration of a partially printed area on a circuit board in one embodiment of the present invention.

FIG. 3 shows a board 326 under an alternative stencil 318. In this embodiment, the alternative stencil 318 is larger than the underlying board 326. Again, the path of travel of the blocking caps 110 is shown as defined areas 116, which has no print due to the presence of the blocking caps 110. The printed area path 316 is shown between the defined areas 116. The alternative board 326, also has board defined areas 320. Again, the defined areas 116 correspond with the location of the previously placed components 130 plus some additional clearance on either side of these components 130. The alternative stencil 318 has numerous apertures 324 through which the attachment media 122 is spread to the board 326 below. Again, there are also holes 131 large enough for their respective components 130 to pass through.

Figure 4:
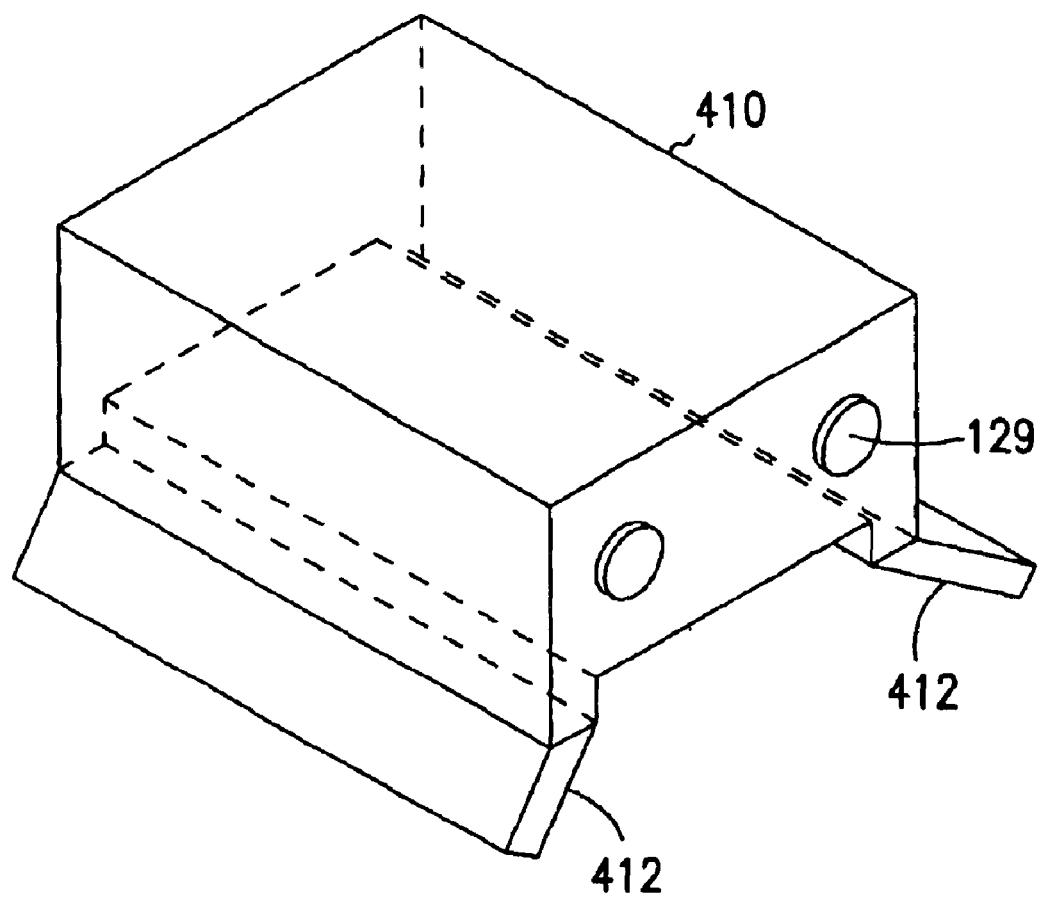
FIG. 4 is a perspective view of an alternative blocking cap in one embodiment of the present invention.

FIG. 4 shows an alternative blocking cap 410 which has square edges and corners rather than rounded edges. In this embodiment, flexible seals 412 are added to the lower outer edges of the alternative blocking cap 410 to provide adding protection against unwanted solder deposition, although the invention is not so limited. The flexible seals 412 can be made from any suitable material, such as metal or plastic. Further testing is necessary to determine the suitably of any particular blocking cap design for a given application and the desirability of adding one or more seals to the previously described blocking caps (110) shown in FIG. 1. In an alternative embodiment, the flexible seals 412 are connected directly to the pressurized squeegee head (not shown in FIG. 4). Refinements to the system of the present invention can be made by testing a variety of blocking caps on pressurized squeegee heads and adjusting the shape, size and position as necessary.

In another embodiment, a new method of manufacturing printed circuit boards is described. This method allows the process of printing to be separated from other steps in the process of manufacturing circuit boards. Specifically, after an individual part is placed on the circuit board, it can be sold to a different manufacturer or returned for finishing to the original company which designed the circuit board. In a conventional process, it is not practical to print on a circuit board, once a part has been placed on the circuit board. By using the blocking cap, it is now feasible and practical to print on a circuit board after one or more parts have been placed on it. Since the blocking cap blocks the flow of the attachment media, one can selectively choose where media should be placed.

Figure 5A:
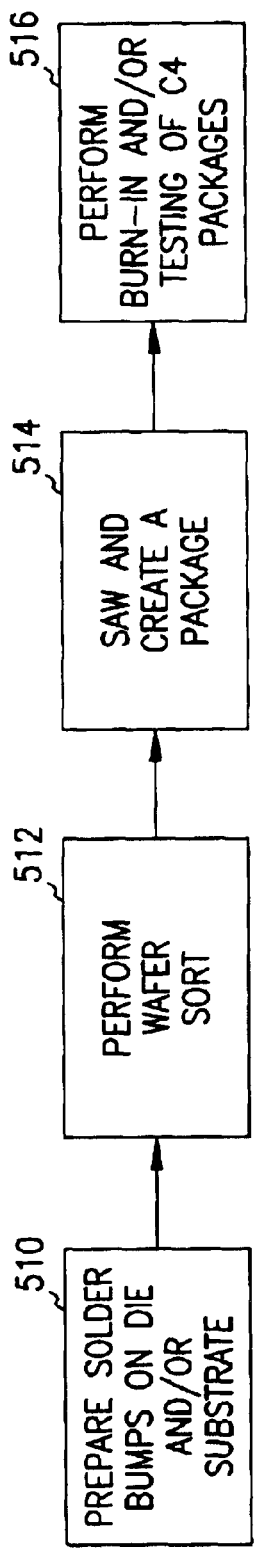
FIG. 5A is a block diagram of a conventional package process in one embodiment of the present invention.

One example of a prior art process is shown in FIG. 5A. This can be any type of ball grid array (BGA) package process, such as the controlled collapse chip connection, i.e., C4 package process, well known in the art. The C4 package process is also referred to as the "flip chip" process. In this process, solder bumps are prepared on the dice and/or on a substrate in step 510. A wafer sort is performed in step 512 to eliminate bad dice. The dice are sawed and a package is created in step 514. Creating of the package typically involves placing each die on a substrate and attaching an array of solder balls to the bottom surface of the substrate, as is known in the art. Testing, which can include burn-in and/or other types of testing known in the art, is performed on the C4 package in step 516.

Figure 5B:
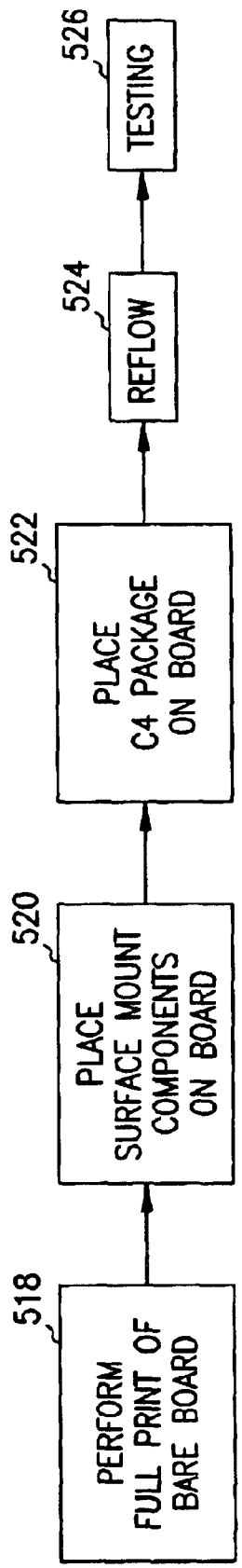
FIG. 5B is a block diagram of a conventional full printing end placement process in one embodiment of the present invention.

A prior art printing and placement process is shown in FIG. 5B. In this process, a full printing of a bare circuit board is performed in step 518. This includes printing with a conventional squeegee or pressurized print head for surface mount components as well as printing for placement of a package, such as a C4 package. Surface mount components are placed on the circuit board in step 520 and the C4 package is placed on the circuit board in step 522. This is followed by conventional reflow in step 524 and testing in step 526, such as an in-circuit test (ICT). Other required and alternative steps known in the art for the C4 package process and the printing and placement process are not discussed herein.

Figure 6:
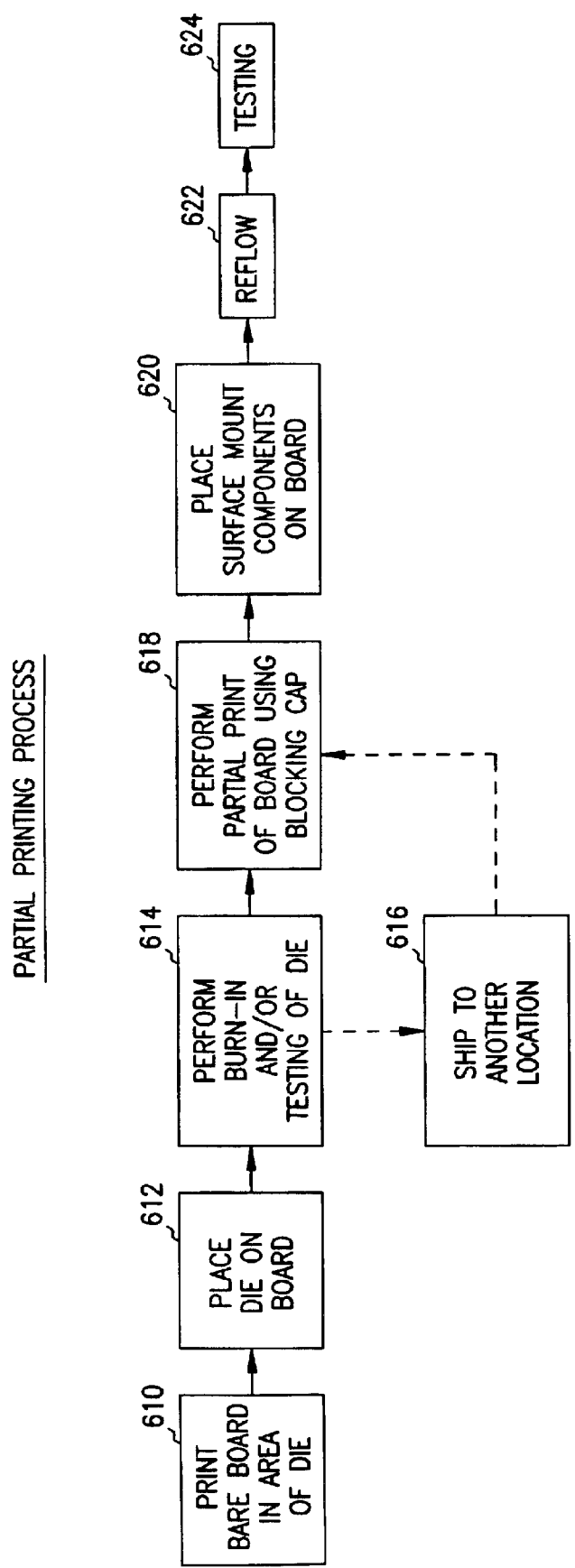
FIG. 6 is a block diagram of a partial printing process in one embodiment of the present invention.

FIG. 6 shows one type of novel process which is made possible with use of the blocking caps of the present invention. A bare circuit board is printed or fluxed for a bare die using any suitable method in step 610, with the bare die being placed on the bare circuit board in step 612, although the invention is not so limited. Any type of component can be added to the bare circuit board in step 612, including a previously-developed package, if desired. However, since it is not necessary to use packages when using the novel partial printing process of the present invention, considerable cost-savings and flexibility can be obtained if packages are not used. A burn-in at an elevated temperature for a suitable length of time and/or testing of the die is performed in step 614. At this point, the circuit board containing the bare die can be shipped to another location, if desired, as shown in step 616, with the buyer performing the remaining steps in the process.

Alternately, the process can continue in the same location. In step 618, a partial print is made on the circuit board containing the previously-added die, using a pressurized squeegee head containing one or more blocking caps as described above. The remaining parts are placed on the circuit board in step 620. This is followed by conventional reflow in step 622 and testing, such as the ICT, in step 624. It should be understood that other types of soldering, such as wave soldering can be performed in step 622. Other tests which are known in the art can also be performed in step 624. Further, in some processes it may be necessary to perform other steps such as a curing step, repair step, and so forth. Other variations are also possible depending on the type of SMT process being used, whether a double-sided circuit board is being produced, etc.

In one embodiment, the blocking cap is used with the conventional mobile module process. In this way, the mobile module process can be altered so that the bare die is added and tested prior to adding all of the other components.

The system of the present invention is more economical and efficient than conventional partial printing processes. By combining a pressurized squeegee head with one or more novel blocking caps, it is now possible to attach a component to a bare circuit board before the SMT process is started, instead of creating a package and then placing it on the circuit board. This feature provides previously unattainable flexibility in the manufacturing process since one or more costly components can be added, burned-in, and/or tested prior to printing and placing all the remaining components. As a result, the process of printing can now be easily separated from other steps in the process of manufacturing circuit boards. Furthermore, by eliminating use of a package, the overall height of the completed circuit board is reduced. Limiting the height of the completed circuit board in this way is extremely important, particularly in applications where overall space is limited, such as in notebook computers.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method for manufacturing printed circuit boards comprising:

placing a component on a circuit board;

partially printing attachment media on the circuit board with a pressurized squeegee head containing at least one blocking cap, wherein no attachment media is printed onto the component; and placing additional components on the circuit board.

2. The method of claim 1 wherein the component is a die.

3. The method of claim 2 further comprising testing the die prior to the partial printing step.

4. The method of claim 1 wherein the attachment media is solder paste, liquid flux or adhesive paste.

5. The method of claim 1 further comprising shipping the circuit board to another location before the partial printing step.

6. The method of claim 1 further comprising reflowing the attachment media and performing in-circuit testing.

7. The method of claim 1 wherein the pressurized squeegee head contains two blocking caps.

8. The method of claim 1 wherein the pressurized squeegee head contains three blocking caps.

9. The method of claim 1 wherein the pressurized squeegee head contains four or more blocking caps.

10. A method comprising:

placing a component on a circuit board;

shipping the circuit board to another location;

partially printing attachment media on the circuit board with a pressurized squeegee head containing at least one blocking cap, wherein no attachment media is printed onto the component; and placing additional components on the circuit board.

11. The method of claim 10 wherein the component is a die.

12. The method of claim 11 further comprising testing the die prior to the partial printing step.

13. The method of claim 10 wherein the attachment media is solder paste, liquid flux or adhesive paste.

14. The method of claim 10 further comprising reflowing the attachment media.

15. The method of claim 14 further comprising performing in-circuit testing.

16. A method for manufacturing printed circuit boards comprising:

placing a die on a circuit board;

partially printing solder paste on the circuit board with a pressurized squeegee head containing at least one blocking cap, wherein no solder paste is printed onto the die; and placing additional components on the circuit board.

17. The method of claim 16 further comprising testing the die prior to the partial printing step.

18. The method of claim 17 further comprising shipping the circuit board to another location before the partial printing step.

19. The method of claim 18 further comprising reflowing the solder paste.

20. The method of claim 19 further comprising performing in-circuit testing.

* * * * *